United States Patent
Yendluri et al.

(10) Patent No.: US 10,958,281 B1
(45) Date of Patent: Mar. 23, 2021

(54) ANALOG-TO-DIGITAL CONVERTOR (ADC) WITH A SYNTHESIZED DELAY STAGE

(71) Applicant: Analog Devices International Unlimited Company, Limerick (IE)

(72) Inventors: Shanthi Pavan Yendluri, Chennai (IN); Hajime Shibata, Toronto (CA)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 16/653,681

(22) Filed: Oct. 15, 2019

(51) Int. Cl.
*H03M 1/14* (2006.01)

(52) U.S. Cl.
CPC .................. *H03M 1/144* (2013.01)

(58) Field of Classification Search
CPC ........... H03M 1/44; H03L 7/083; H03L 7/183
USPC ................... 341/155–165; 327/149; 370/518
See application file for complete search history.

(56) References Cited

U.S. PATENT DOCUMENTS

| | | | | |
|---|---|---|---|---|
| 5,598,158 A * | 1/1997 | Linz | .......................... | G06F 3/16 341/143 |
| 5,910,740 A * | 6/1999 | Underwood | ............ | H03L 7/083 327/149 |
| 6,556,158 B2 | 4/2003 | Steensgaard-Madsen | | |
| 7,154,495 B1 * | 12/2006 | Bucklen | ................. | G09G 5/006 345/213 |
| 7,315,269 B2 | 1/2008 | Schreier et al. | | |
| 8,604,962 B1 * | 12/2013 | Lewyn | ................ | H03M 1/0863 341/162 |
| 8,896,475 B2 | 11/2014 | Shibata | | |
| 9,312,840 B2 | 4/2016 | Dong et al. | | |
| 9,762,221 B2 | 9/2017 | Dong et al. | | |
| 2002/0175770 A1 * | 11/2002 | Cyrusian | ................ | G11C 5/147 331/17 |
| 2007/0194969 A1 * | 8/2007 | Bucklen | .............. | H03M 1/1245 341/155 |
| 2009/0079598 A1 * | 3/2009 | Furuta | .................... | H03H 17/04 341/61 |
| 2010/0156692 A1 * | 6/2010 | Jeon | ...................... | H03M 1/164 341/162 |
| 2010/0164774 A1 * | 7/2010 | Madoglio | ........... | H03M 7/3004 341/143 |
| 2010/0260242 A1 * | 10/2010 | Abe | ...................... | H03L 7/0812 375/219 |
| 2017/0123381 A1 * | 5/2017 | Peretz | .................... | H03M 1/504 |
| 2019/0296756 A1 * | 9/2019 | Ali | ........................ | H03M 1/002 |
| 2020/0136639 A1 * | 4/2020 | Kinyua | ................. | H03F 3/3028 |

* cited by examiner

*Primary Examiner* — Lam T Mai
(74) *Attorney, Agent, or Firm* — Patent Capital Group

(57) ABSTRACT

Embodiments may relate to a circuit for use in an analog-to-digital converter (ADC) circuit. The circuit may include a first residue amplifier stage and a second residue amplifier stage. The circuit may further include a synthesized delay stage with a digital-to-analog converter (DAC) electrically positioned between a signal input and the input of the second residue amplifier stage. The circuit may further include a resistor electrically positioned between the signal input and the input of the second residue amplifier stage. Other embodiments may be described or claimed.

30 Claims, 8 Drawing Sheets

US 10,958,281 B1

ANALOG-TO-DIGITAL CONVERTOR (ADC) WITH A SYNTHESIZED DELAY STAGE

FIELD OF THE DISCLOSURE

This disclosure relates in general to the field of computing and, more particularly, though not exclusively, to a system and method for the manufacture or use of an analog-to-digital convertor (ADC) with a synthesized delay stage.

BACKGROUND

In many electronic applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an ADC as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs may be found in many places such as broadband communication systems, audio systems, receiver systems, etc. ADCs may translate analog electrical signals that represent real-world phenomena (e.g., light, sound, temperature, pressure, etc.) for data processing purposes. ADCs may be used in a broad range of applications including Communications, Energy, Healthcare, Instrumentation and Measurement, Motor and Power Control, Industrial Automation, and Aerospace/Defense. Designing an ADC may be a nontrivial task because each application may have different needs in terms of speed, performance, power, cost, or size.

SUMMARY OF THE DISCLOSURE

Figure 1:
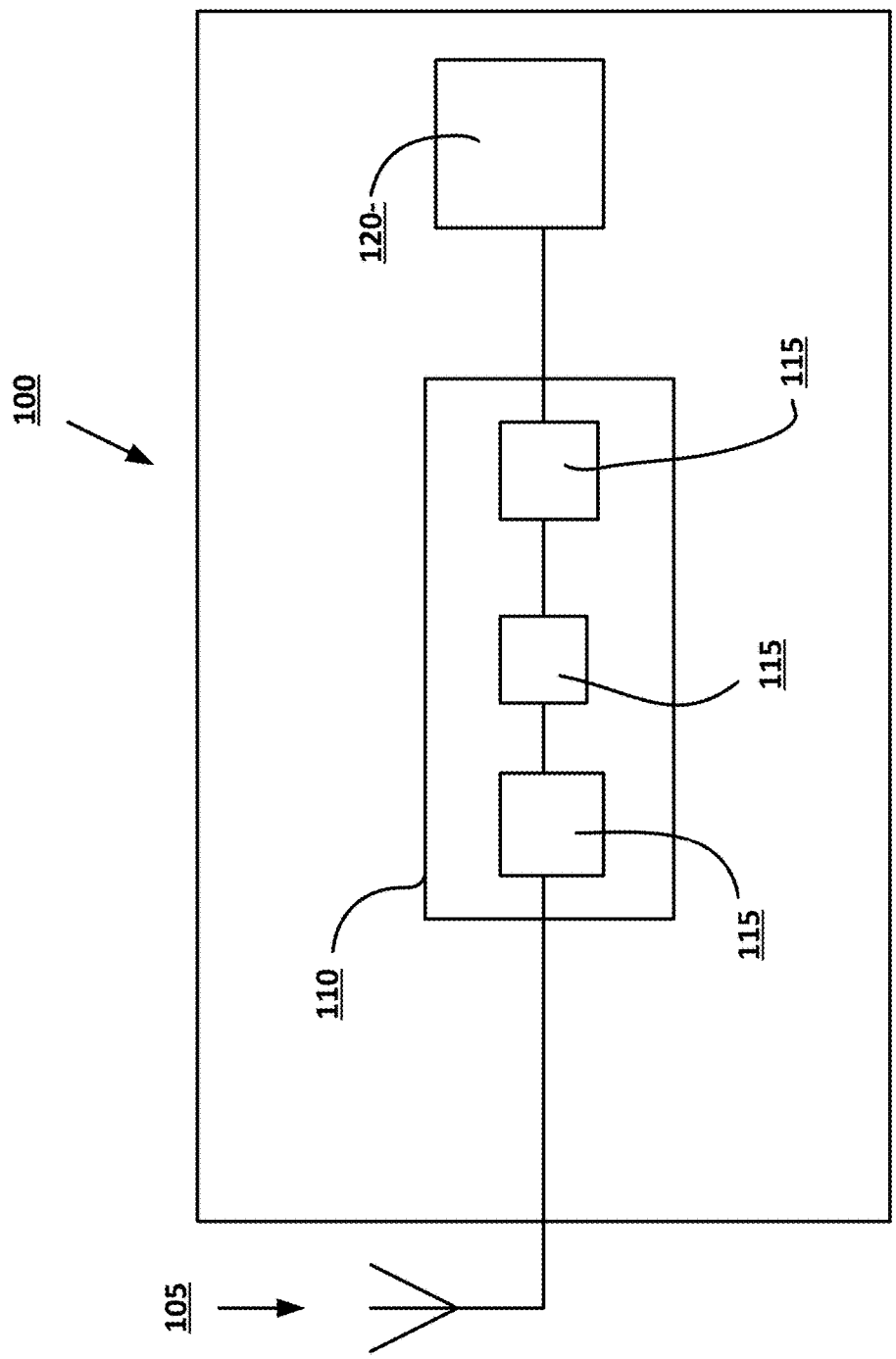
FIG. 1 depicts an example of an electronic device with an ADC that includes a residue amplifier and a synthesized delay stage, in accordance with various embodiments.

Embodiments may relate to a circuit for use in an ADC circuit. The circuit may include a first residue amplifier stage and a second residue amplifier stage. The circuit may further include a synthesized delay stage with a digital-to-analog converter (DAC) electrically positioned between a signal input and the input of the second residue amplifier stage. The circuit may further include a resistor electrically positioned between the signal input and the input of the second residue amplifier stage. Other embodiments may be described or claimed.

One embodiment may relate to a circuit for use in an ADC circuit, wherein the circuit comprises: a first residue amplifier stage coupled with a signal input; a second residue amplifier stage with an input coupled with an output of the first residue amplifier stage; and a synthesized delay stage that includes: a DAC electrically positioned between the signal input and the input of the second residue amplifier stage; and a resistor electrically positioned between the signal input and the input of the second residue amplifier stage.

Another embodiment may relate to a method of manufacturing an ADC circuit, wherein the method comprises: identifying a signal input; electrically coupling an input of a first residue amplifier stage with the signal input; electrically coupling an input of a second residue amplifier stage with an output of the first residue amplifier stage; and electrically coupling a synthesized delay stage with the signal input and the input of the second residue amplifier stage, wherein the synthesized delay stage includes a DAC and a variable resistor.

Another embodiment may relate to an electronic device comprising: an analog signal source to provide an analog signal; a processor to process a digital signal; and an ADC circuit to convert the analog signal to the digital signal, wherein the ADC circuit includes: a first residue amplifier stage communicatively coupled with the analog signal source; a second residue amplifier stage communicatively positioned between the analog signal source and the processor; and a synthesized delay stage that is communicatively positioned between the signal input and the input of the second residue amplifier stage, wherein the synthesized delay stage includes a DAC and a variable resistor.

DETAILED DESCRIPTION

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact. Generally, the term "electrical coupling" may refer to a coupling wherein two or more elements are able to exchange electrical signals with one another, for example via a wired connection. The term "communicative coupling" may refer to a coupling wherein two or more elements are able to exchange data or communicative signals with one another, for example via a wired or a wireless connection.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an application-specific integrated circuit (ASIC), an electronic circuit, a processor (shared, dedicated, or group) or memory (shared, dedicated, or group) that execute one or more software or firmware programs, a combinational logic circuit, or other suitable components that provide the described functionality.

As noted, ADCs are electronic devices that may convert a continuous physical quantity carried by an analog signal to a digital number that represents the quantity's amplitude (or, to a digital signal carrying that digital number). The conversion may involve quantization of the analog input signal, so it may introduce a small amount of error. Typically, the quantization may occur through periodic sampling of the analog input signal. The result of the quantization may be a sequence of digital values (i.e., a digital signal) that has converted a continuous-time and continuous-amplitude analog input signal to a discrete-time and discrete-amplitude digital signal.

An ADC may be defined by its bandwidth or its resolution. Its bandwidth may refer to the range of frequencies of analog signals that the ADC may convert to a digital signal. Its resolution may refer to the number of discrete levels the maximum analog signal may be divided into and represented in the digital signal. An ADC may also have various specifications for quantifying ADC dynamic performance. The specifications may include, for example, signal-to-noise-and-distortion ratio (SINAD), effective number of bits (ENOB), signal-to-noise ratio (SNR), total harmonic distortion (THD), total harmonic distortion plus noise (THD+N), spurious free dynamic range (SFDR) or others. Generally, ADCs may have different designs, which may be chosen based on factors such as application requirements or performance specifications.

There are a variety of different types of ADCs, and one such type is a continuous-time pipeline ADC. Generally, continuous-time pipeline ADCs may not use switched capacitor circuits. Rather, such an ADC may enable wide-bandwidth operation with continuous-time benefits. However, the realization of the continuous-time delay may be difficult in some designs. An inductor-capacitor (LC) lattice structure may provide for desirable delay, but the on-ship inductors may require a relatively large silicon area on the chip. Resistor-capacitor (RC) lattice structures may result in an ADC with a smaller silicon area, but the flat-delay bandwidth of such an ADC may be more limited. Therefore, the use of an RC lattice may not be desirable for some wide-bandwidth applications. Specifically, wide-bandwidth applications with an over-sampling ratio (OSR) of 4 of greater may not benefit from legacy RC lattice structures.

By contrast, embodiments herein may relate to the extension of flat-delay bandwidth by taking advantage of a high-order residue amplifier with multiple integrators. By allowing extra feed-in terms both from an input and a cancellation DAC, one may introduce numerators and denominators in the s-domain rational equation on the path where an original delay line is located. The equivalent delay may be synthesized by adjusting those numerator and denominator coefficients so that the delay line may be reduced or removed.

FIG. 1 depicts an example of an electronic device 100 with an ADC circuit that includes a residue amplifier and a synthesized delay stage, in accordance with various embodiments.

The electronic device 100 may include a number of components. For example, the electronic device 100 may include an antenna 105 to generate an analog signal, as described above. It will be understood that although the antenna 105 is depicted as generally external to the electronic device 100, in other embodiments the electronic device 100 may have a plurality of antennas, a single antenna that is internal (or partially internal) to the electronic device 100, or some other variation. In some embodiments, the electronic device 100 may additionally or alternatively have a different type of a signal source such as a sensor that may be configured to generate an analog signal related to some parameter such as heat, humidity, accelerator, orientation, etc.

The analog source (e.g., the antenna 105) may be communicatively coupled with an ADC circuit 110. The ADC circuit 110 may implement, be, or be part of a continuous-time pipeline ADC, and include a number of components 115. Although 3 components 115 are depicted in FIG. 1 in series, it will be understood that in other embodiments the ADC circuit 110 may include more or fewer components, and two or more components may be arranged in parallel with one another in the signal path. The various components 115 may be, for example, passive components such as resistor, capacitors, etc. Additionally or alternatively, one or more of the various components 115 may be an active component such as an ADC component, a DAC component, an integrator, or some other type of active component.

The electronic device 100 may further include a digital processor 120. The digital processor 120 may be, for example, a central processing unit (CPU), a general processing unit (GPU), a single-core processor, a multi-core processor, a core of a multi-core processor, or some other type of processor. In operation, the analog signal source (e.g., the antenna 105) may provide an analog signal to the ADC circuit 110. The ADC circuit 110 may process the analog signal as described above (e.g., through sampling or quantization) to generate a digital signal that is related to or representative of, the analog signal. The ADC circuit 110 may then supply that digital signal to the digital processor 120 for further processing.

Generally, in a continuous-time pipeline ADC such as ADC circuit 110, it may be desirable to delay the input. In legacy continuous-time pipeline ADCs, a delay line may have been used. Specifically, the delay line may have been coupled with a residue amplifier of the ADC. However, in embodiments herein, the delay line may be at least partially removed from the ADC circuit and, instead, the ADC circuit may include a synthesized delay stage that is coupled with the residue amplifier.

Figure 2:
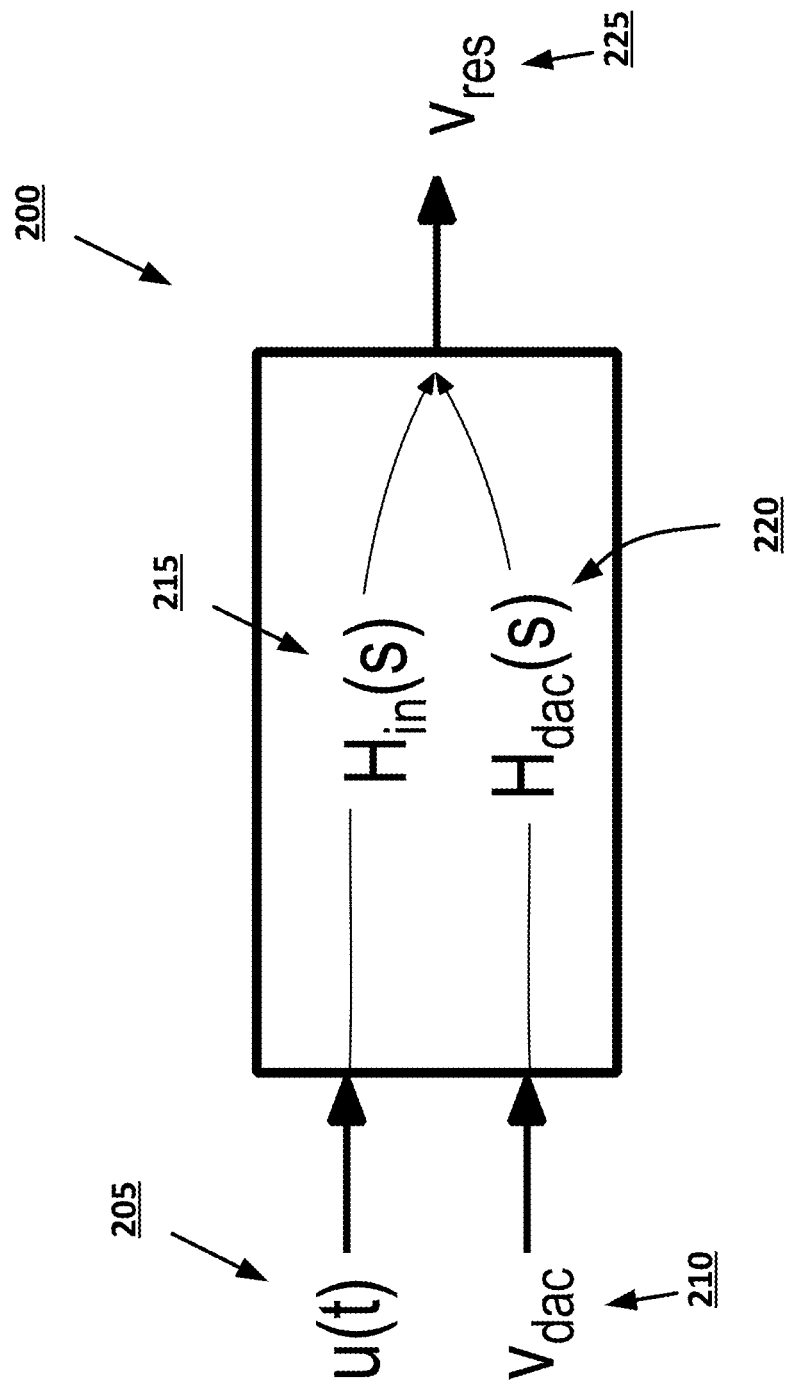
FIG. 2 depicts a simplified model of an example residue amplifier that may be used in an ADC, in accordance with various embodiments.

FIG. 2 depicts a simplified example model of a residue amplifier that may be used in a continuous-time pipeline ADC such as ADC circuit 110, in accordance with various embodiments. Specifically, an input signal u(t) at 205 may be input to the residue amplifier 200. Additionally, a voltage, $V_{DAC}$ at 210 may be provided to the residue amplifier 200 from a DAC. The residue amplifier 200 may then execute two transfer functions $H_{in}(s)$ at 215 and $H_{dac}(s)$ at 220. The transfer function $H_{in}(s)$ at 215 may represent, for example, the transfer function of a first signal path. In legacy ADCs, the transfer function at 215 may have been the transfer function of a signal path with a delay line. The transfer function $H_{dac}(s)$ at 220 may represent, for example, the transfer function of the signal path with the DAC. Generally, the transfer functions at 215 and 220 may be a mathematical function that depicts an expected output of a stage of the ADC for a variety of inputs. As can be seen, the transfer functions may be functions of (s), which may represent a complex frequency. In other words, the transfer functions at 215 and 220 may model expected outputs when a signal with a given complex frequency is used as an input.

The results of the transfer functions at 215 and 220 may then be processed to form an output signal $v_{res}$ at 225. The output signal at 225 may be provided, for example, to a digital processor such as processor 120 for further interpretation or processing.

Figure 3:
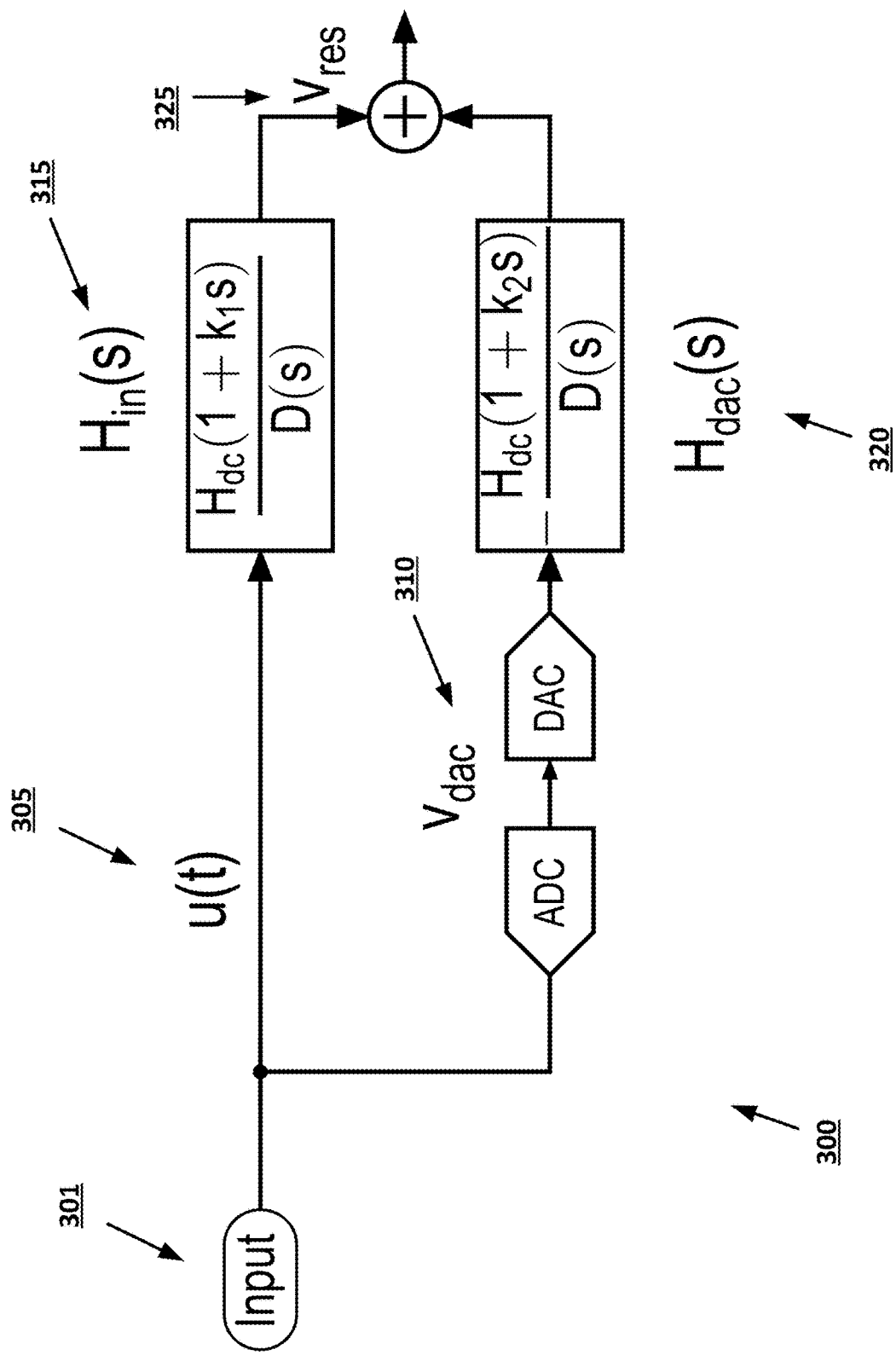
FIG. 3 depicts a high-level model of an ADC that includes a synthesized delay stage, in accordance with various embodiments.

As noted previously, in various embodiments the delay line may be at least partially removed from the ADC, and instead a synthesized delay stage may be used. FIG. 3 depicts a high-level model of an ADC that includes a synthesized delay stage, in accordance with various embodiments.

Generally, the model of FIG. 3 may include elements similar to those of the model of FIG. 2. Specifically, the model of FIG. 3 may include an input signal u(t) at 305 which may be, or may be a function of, an analog signal provided by an input 301. The input 301 may be similar to, and share one or more characteristics with, a previously described input source such as antenna 105. The input signal at 305 may be similar to, and share one or more characteristics with, the input signal at 205. Similarly, the model at FIG. 3 may include a voltage $v_{DAc}$ at 310. The voltage at 310 may be similar to, and share one or more characteristics with, the voltage at 210. As may be seen in FIG. 3, the voltage at 310 may be the result of a signal propagating through an ADC component into a DAC component, which may output a voltage $v_{DAC}$. As may be seen, the input signal at 305

The model of FIG. 3 may further include a pair of transfer functions at 315 and 320. The transfer functions may be $H_{in}(s)$ at 315 and $H_{dac}(s)$ at 320, which may be respectively similar to, and share one or more characteristics of, the transfer functions at 215 and 220. Specifically, the transfer function at 315 may represent the transfer function of a first signal path, and the transfer function at 320 may represent the transfer function of a signal path with a DAC as shown in FIG. 3. The transfer function at 315 may be represented by the following equation: $H_{dc}(1+k_1 s)/D(s)$ wherein $H_{dc}$ represents an initial transfer function, $k_1$ is a variable related to the synthesized delay, and D(s) is a constant related to a Butterworth filter. Similarly, the transfer function at 320 may be represented by the following equation: $-H_{dc}(1+k_2 s)/D(s)$ where $H_{dc}$ is likewise an initial transfer function, $k_2$ is a variable related to the synthesized delay, and D(s) is the constant related to the Butterworth filter.

The results of the transfer functions at 315 and 320 may be summed by, for example, an integrator, to produce an output signal at 325. The output signal at 325 may be similar to, and share one or more characteristics with, the output signal $v_{res}$ at 225. Specifically, the output signal at 325 may be provided to a processor such as processor 120 for further processing.

Generally, the coefficients related to the synthesized delay, $k_1$ and $k_2$, may need to be selected based on the parameters of the specific ADC in which the synthesized delay stage will be used. Specifically, the coefficients $k_1$ and $k_2$ may be selected to, for example, minimize voltage swing of the output signal at 325. Selection of the coefficients may be done through modeling of the system such as may be done through various computer software programs. As one example, in an embodiment where $H_{dc}$ is 2.5 and the ADC has an OSR of 4, $k_1$ may be equal to $-0.21$ and $k_2$ may be equal to 0.2. In another embodiment where $H_{dc}$ is 2.5 and the ADC has an OSR of 2, $k_1$ may be equal to 0.73 and $k_2$ may be equal to 0.83. It will be understood that these example values are intended only as very specific examples, and other embodiments may have different values for $k_1$ or $k_2$.

Figure 4:
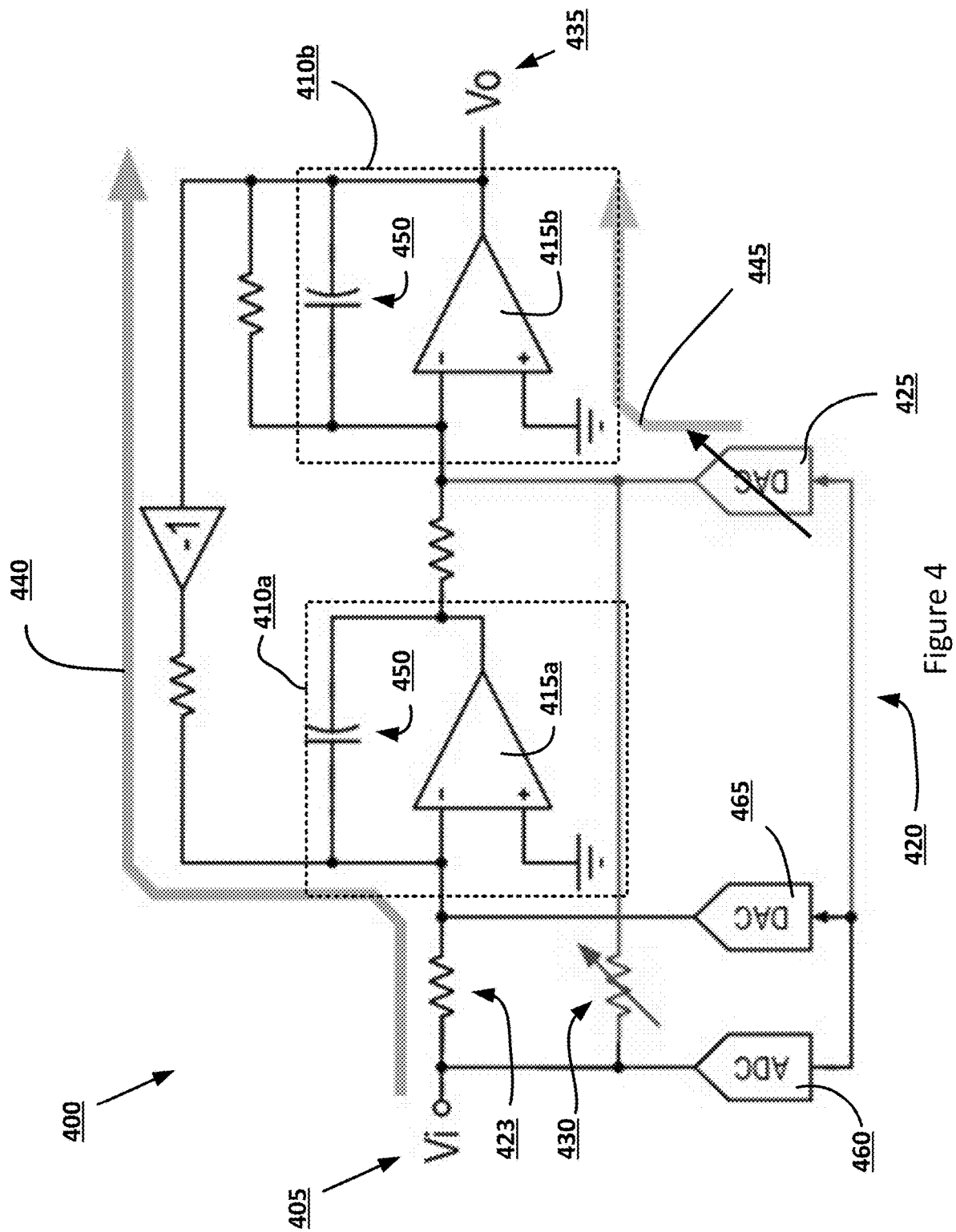
FIG. 4 depicts an example circuit diagram of an implementation of a synthesized delay stage and a residue amplifier of an ADC, in accordance with various embodiments.

FIG. 4 depicts an example circuit diagram of an implementation of a synthesized delay stage and a residue amplifier of an ADC, in accordance with various embodiments. Specifically, the circuit diagram may depict an example configuration of an ADC circuit 400 by which the synthesized delay described above may be implemented.

The ADC circuit 400 may include a signal input at 405 which may provide an input signal to the circuit. The signal input 405 may be communicatively coupled with, for example, an analog source such as antenna 105. More generally, the signal input 405 may be, or may be communicatively coupled with an input that provide an input signal such as the input signals at 205 or 305. The ADC circuit 400 may also include a signal output 435. The signal output 435 may be communicatively coupled with, for example, a processor such as processor 210. Specifically, the signal output 435 may be configured to provide an output signal such as the output signal at 225 or 325 to another component of an electronic device of which the ADC circuit 400 is a part.

The ADC circuit 400 may include one or more residue amplifier stages such as residue amplifier stages 410a and 410b (collectively, residue amplifier stages 410). Because two residue amplifier stages 410 are depicted in the configuration of FIG. 4, the ADC circuit 400 may be referred to as being or including a "second-order residue amplifier." It will be understood, however, that in other embodiments an ADC may have an increased number of residue amplifier stages. Such an embodiment is described in greater detail with respect to FIG. 6, below.

Generally, respective ones of the residue amplifiers stages 410 may include an integrator (which may also be referred to as an integration amplifier or an integration operational amplifier) such as integrators 415a and 415b (collectively, integrators 415). The integrators 415 may be configured to perform integration of a signal with respect to time. The residue amplifier stages 410 may also include an integrating capacitor 450, which may be coupled with both an input and an output of a respective integrator 415.

It will be understood that although the residue amplifier stages 410 are depicted as having a specific number of elements in a specific configuration (e.g., an integrator 415, an integrating capacitor 450, a connection to ground) in other embodiments one or more of the residue amplifier stages 410 may include more or fewer elements, either depicted or not depicted. For example, in some embodiments a residue amplifier stage may be considered to include the resistor that is depicted immediately to the left of both of the residue amplifier stages 410. In some embodiments, the residue amplifier stage 410 may not be considered to include the integrating capacitor 450 or the connection to ground. In some embodiments, additional passive or active components such as additional resistors, capacitors, integrators, inductors, etc. may be present in one or more of the residue amplifier stages 410. Other variations may be present in other embodiments.

The ADC circuit 400 may further include a resistor 423 coupled with the signal input 405, and an ADC/DAC chain in parallel with the resistor 423. Specifically, as may be seen, ADC 460 and DAC 465 may be positioned in series with one another and in parallel with the resistor 423. The input of the ADC 460 may be communicatively coupled with the signal input 405, and then the input of the DAC 465 may be communicatively coupled with the output of the ADC 460. The resistor 423 may be communicatively coupled to both the input of the ADC 460 and the output of the DAC 465.

The ADC circuit 400 may further include a synthesized delay stage 420, which may include a resistor 430 and a DAC 425. In some embodiments the resistor 430 may be a variable resistor, as depicted. Although a resistor is discussed herein with respect to element 430, in other embodiments the resistor 430 (or some other resistor herein) may be replaced by a transconductor.

Further, the DAC 425 may be a variable DAC (e.g., a cancellation DAC with a variable gain). As may be seen, the variable resistor 430 may be generally in parallel with the first residue amplifier stage 410a and electrically coupled between the signal input 405 and the second residue amplifier stage 410b. Similarly, the DAC 425 may be in parallel with the DAC 465. More specifically, the input of the DAC 425 may be communicatively coupled with the output of the ADC 460. The output of the DAC 425 may be communicatively coupled with the residue amplifier stage 410b. Similarly to the residue amplifier stages the depiction of the synthesized delay stage 420 is intended as one example depiction of such a synthesized delay stage. In other embodiments a synthesized delay stage may include additional elements such as an additional resistor, additional passive or active components, etc.

As noted above with respect to FIG. 3, the function of the ADC may be related to two values, $k_1$ and $k_2$. The elements of the synthesized delay stage 420 may provide the values $k_1$ and $k_2$. Specifically, the resistance value of the resistor 430 of the synthesized delay stage 420 may be selected to implement $k_1$. The gain value of the DAC 425 of the synthesized delay stage 420 may be selected to implement $k_2$. In some embodiments, it may also be desirable to tune the capacitance values of the integrating capacitors 450. Specifically, the values of the integrating capacitors 450 may be tuned to provide feed-in coefficients with a fixed clock-rate during variable clock-rate operation of the ADC circuit 400.

Additionally, this implementation of the ADC circuit 400 may enable two filters. The first filter may be a lowpass filter 440 as shown in FIG. 4. Simultaneously, the synthesized delay stage 420 may implement a bandpass filter 445.

Figure 5:
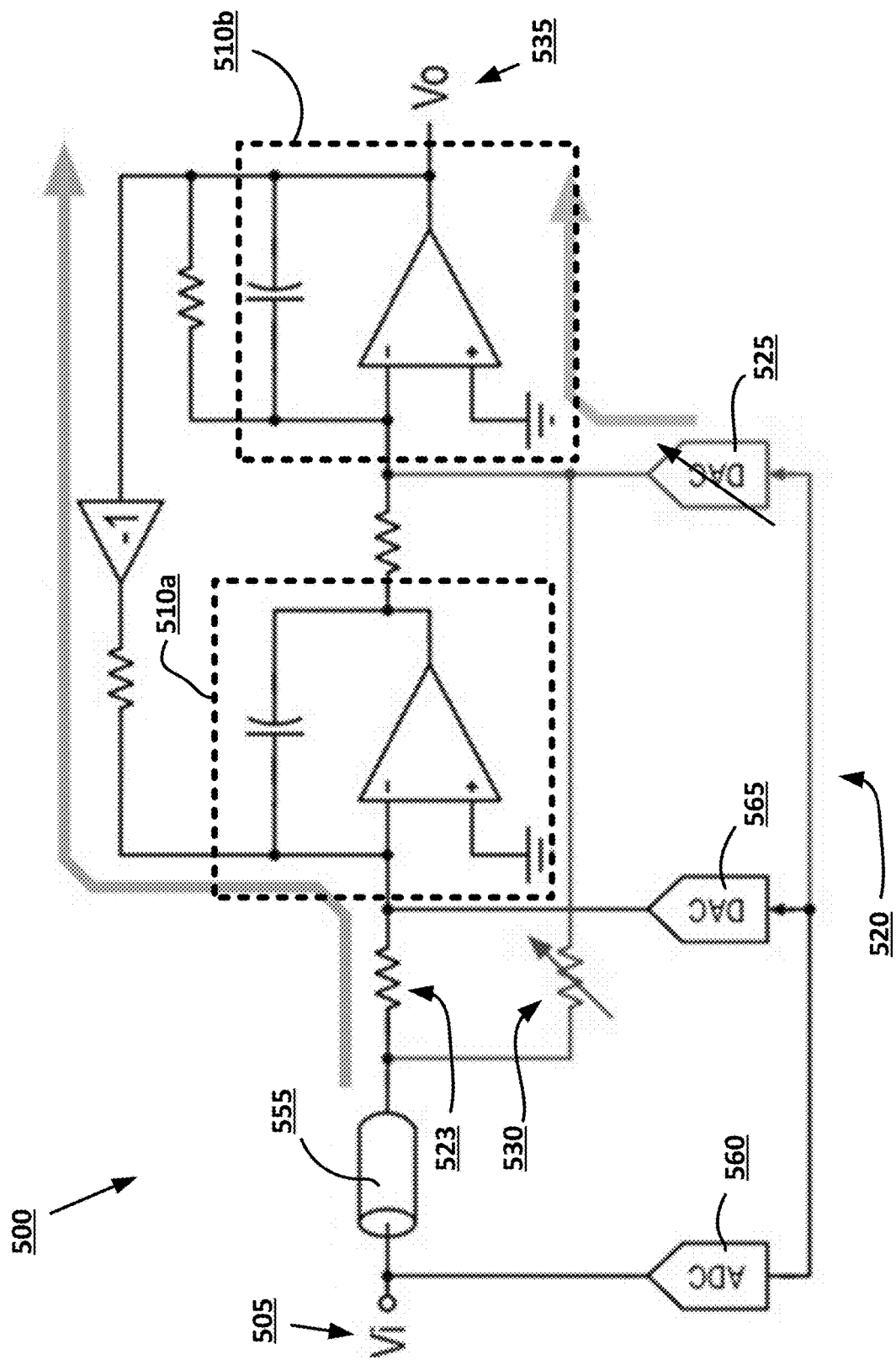
FIG. 5 depicts an alternative example circuit diagram of an implementation of an ADC with a residue amplifier and a synthesized delay stage, in accordance with various embodiments.

As may be seen, the implementation of the synthesized delay stage 420 may eliminate the use of a delay line. The synthesized delay stage 420 may be appropriate for ADCs with an OSR of 4 or above. Such ADCs may be referred to as, for example, a "narrow-bandwidth ADC having an OSR of 4 or above." However, in some embodiments a lower OSR (e.g., 4 or below), it may still be desirable to implement at least part of a delay line. FIG. 5 depicts an example of an ADC circuit 500 with a delay line 555.

The ADC circuit 500 may include a signal input 505 and a signal output 535, which may be respectively similar to, and share one or more characteristics with, signal input 405 and signal output 435. The ADC may have two residue amplifier stages 510a and 510b (collectively residue amplifier stages 510), which may be respectively similar to, and share one or more characteristics with, residue amplifier stages 410. The ADC circuit 500 may further include an ADC 560 and a DAC 565, which may be respectively similar to, and share one or more characteristics with, ADC 460 and DAC 465. The ADC circuit 500 may further include a resistor 523, which may be similar to, and share one or more characteristics with, resistor 423. The ADC circuit 500 may further include a synthesized delay stage 520 with a resistor 530 and a DAC 525, which may be respectively similar to, and share one or more characteristics with, synthesized delay stage 420, resistor 430, and DAC 425.

The ADC circuit 500 may further include a delay line 555. In some embodiments, the delay line 555 may be an inductor, a length of wire, or some other type of delay line. As may be seen, the delay line 555 may be electrically coupled between the signal input 505 and the resistor 523, as well as between the signal input 505 and the resistor 530.

The delay line 555 may be desirable to introduce additional delay into the ADC circuit 500 in conjunction with the synthesized delay stage 520. The additional delay may be desirable in ADCs with an OSR at or below 4. Specifically, the delay line 555 may realize a portion of the input delay, while the resistor 530 and the DAC 525 realize the remainder of the input delay and the DAC advance.

Figure 6:
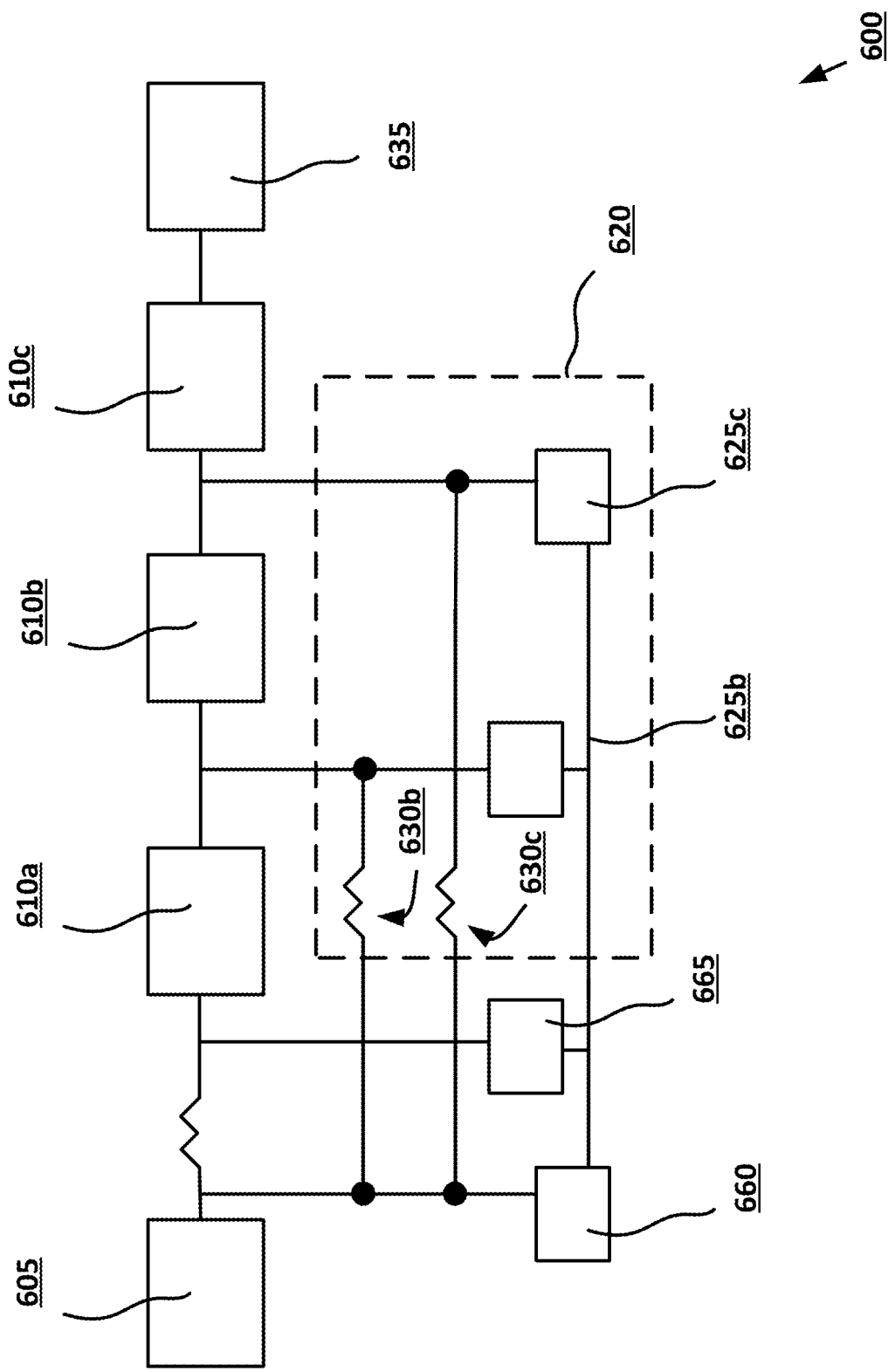
FIG. 6 depicts a high-level block diagram of an implementation of an ADC with a residue amplifier and a synthesized delay stage, in accordance with various embodiments.

The ADCs of FIGS. 3 and 4 are depicted with two residue amplifier stages, and therefore may be referred to as being or including a second-order residue amplifier as described above. However, it will be understood that the synthesized delay stage discussed herein may be implemented in an ADC that is or includes a higher-order amplifier. FIG. 6 depicts a high-level block diagram of an implementation of an ADC circuit 600 with a residue amplifier and a synthesized delay stage, in accordance with various embodiments.

The ADC circuit 600 may include a signal input 605 and a signal output 635, which may be respectively similar to, and share one or more characteristics with, signal input 405 and signal output 435. The ADC circuit 600 may also include an ADC 660 and a DAC 665, which may be respectively similar to, and share one or more characteristics with, ADC 460 and DAC 465. The ADC circuit 600 may also include a number of residue amplifier stages, 610a, 610b, and 610c (collectively residue amplifier stages 610). Respective ones of the residue amplifier stages 610 may be similar to, and share one or more characteristics with residue amplifier stages 410. In this embodiment, the ADC circuit 600 may described as being or including a third-order residue amplifier because it includes three residue amplifier stages.

The ADC circuit 600 may further include a synthesized delay stage 620 which may be similar to, and share one or more characteristics with, synthesized delay stages 420 or 520. Specifically, the synthesized delay stage 620 may include a plurality of DACs 625b and 625c, which may each be similar to, and share one or more characteristics with, DAC 425. Similarly, the synthesized delay stage may include a plurality of resistors 630b and 630c, which may each be similar to, and share one or more characteristics with, resistor 430.

As can be seen, respective ones of the DACs and the resistors may be electrically positioned between the signal input 605 and one of the residue amplifier stages. For example, resistor 630*b* and DAC 625*b* may be electrically positioned between the signal input 605 and the residue amplifier stage 610*b*. Similarly, resistor 630*c* and DAC 625*c* may be electrically positioned between the signal input 605 and the residue amplifier stage 610*c*. In this way, the synthesized delay values $k_1$ and $k_2$ may be individually tuned for respective ones of the residue amplifier stages 610.

Generally, it will be understood that the Figures depicted herein are intended as examples of various embodiments, and other embodiments may have one or more variations from what is depicted. For example, in some embodiments DACs 625*b* and 625*c* may not be in series, but rather may be in parallel and both connected to, for example, the output of DAC 665. Some embodiments may have even higher-ordered residue amplifiers including additional residue amplifier stages. Some embodiments may have additional active or passive elements that are not depicted in the various Figures. Some embodiments may have additional amplifier stages positioned between, for example, a residue amplifier stage and a signal output of the ADC. These additional amplifier stages may be of a different type than a residue amplifier stage. Other variations may be present in other embodiments.

Figure 7:
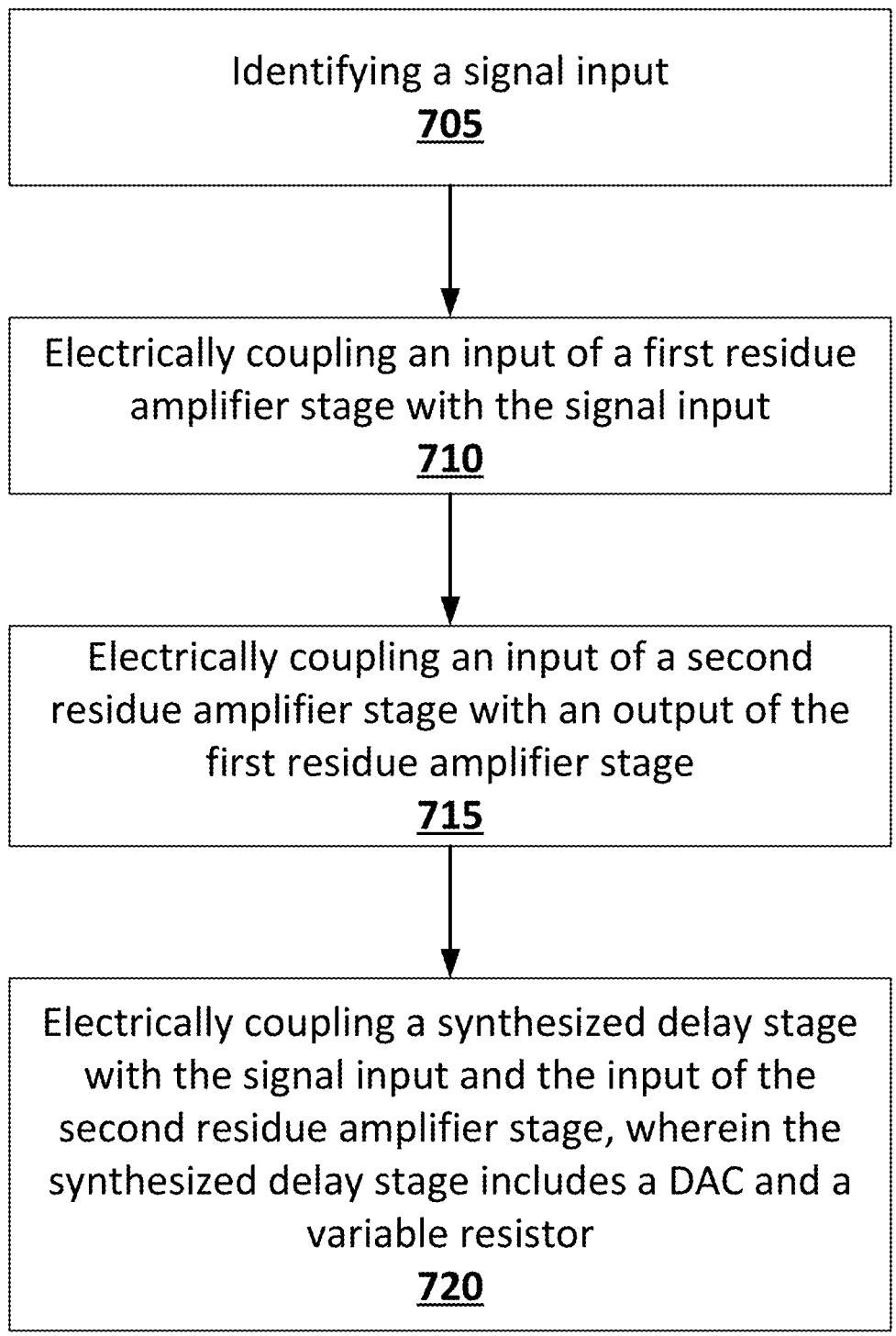
FIG. 7 depicts an example technique for the manufacture of an ADC that includes a residue amplifier and a synthesized delay stage, in accordance with various embodiments.

FIG. 7 depicts an example technique for the manufacture of an ADC that includes a residue amplifier and a synthesized delay stage, in accordance with various embodiments. FIG. 7 will be described herein with reference to elements of FIG. 4, however it will be understood that FIG. 7 may be applicable, in whole or in part, with or without modification, to the manufacture of other embodiments of the present disclosure.

The technique may include identifying, at 705, a signal input. The signal input may be similar to, for example, signal input 405.

The technique may further include electrically coupling, at 710, an input of a first residue amplifier stage with the signal input. The first residue amplifier stage may be similar to, for example residue amplifier stage 410*a*.

The technique may further include electrically coupling, at 715, an input of a second residue amplifier stage with an output of the first residue amplifier stage. The second residue amplifier stage may be similar to, for example, residue amplifier stage 410*b*.

The technique may further include electrically coupling, at 720, a synthesized delay stage with the signal input and the input of the second residue amplifier stage. The synthesized delay stage may be similar to, for example, synthesized delay stage 420. The synthesized delay stage may include a DAC and a variable resistor which may be similar to, for example DAC 425 and resistor 430.

It will be understood that this example technique is intended as one example, and other embodiments may have other variations. For example, in some embodiments, the technique may include more or fewer elements than discussed with respect to FIG. 7. Some embodiments may include elements in a different order than depicted, or certain elements (e.g., elements 710 and 715) may be performed concurrently with one another. Other variations may be present in other embodiments.

Figure 8:
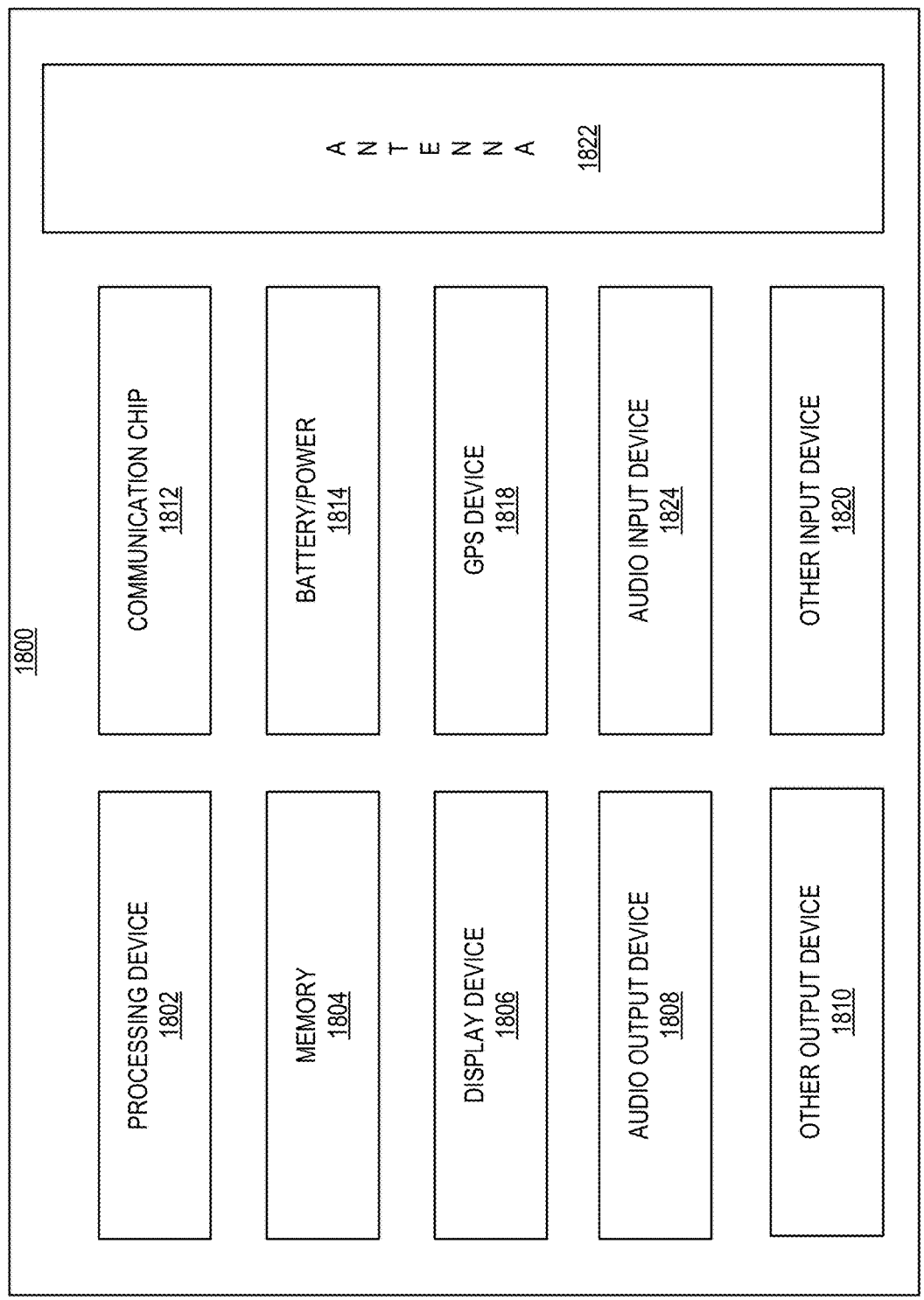
FIG. 8 is a block diagram of an example electrical device that may include a and ADC with a residue amplifier and a synthesized delay stage, in accordance with various embodiments.

FIG. 8 is a block diagram of an example electrical device 1800 that may include one or more ADCs with a residue amplifier and a synthesized delay stage, in accordance with any of the embodiments disclosed herein. A number of components are illustrated in FIG. 8 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 8, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), ASICs, CPUs, graphics processing units, crypto-processors (specialized processors that execute cryptographic algorithms within hardware), server processors, or any other suitable processing devices. The electrical device 1800 may include a memory 1804, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include another output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include another input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

EXAMPLES OF VARIOUS EMBODIMENTS

Example 1 includes a circuit for use in an ADC circuit, wherein the circuit comprises: a first residue amplifier stage coupled with a signal input; a second residue amplifier stage with an input coupled with an output of the first residue amplifier stage; and a synthesized delay stage that includes: a DAC electrically positioned between the signal input and the input of the second residue amplifier stage; and a resistor electrically positioned between the signal input and the input of the second residue amplifier stage.

Example 2 includes the circuit of example 1, wherein the ADC circuit has an OSR greater than or equal to 4.

Example 3 includes the circuit of example 1, wherein the DAC and the resistor are electrically coupled with an output of the first residue amplifier stage.

Example 4 includes the circuit of example 1, wherein the second residue amplifier stage includes an integrator, and the DAC and resistor are coupled with an input of the integrator.

Example 5 includes the circuit of example 1, wherein the resistor is further electrically coupled with the output of the DAC.

Example 6 includes the circuit of example 5, wherein the synthesized delay stage further includes an ADC component electrically positioned between the signal input and the DAC.

Example 7 includes the circuit of example 1, wherein the ADC circuit enables a lowpass filter and a bandpass filter in parallel with one another.

Example 8 includes the circuit of example 1, wherein the synthesized delay stage is to introduce a delay into at least one signal pathway of the ADC circuit.

Example 9 includes the circuit of any of examples 1-8, wherein the DAC is a cancellation DAC with a variable gain, and a value of the variable gain is based on peak voltage swing at an output of the ADC circuit.

Example 10 includes the circuit of example 9, wherein the value of the variable gain is based on minimization of the peak voltage swing.

Example 11 includes the circuit of any of examples 1-8, wherein the resistor is a variable resistor, and a value of the variable resistor is based on peak voltage swing at an output of the ADC circuit.

Example 12 includes the circuit of example 11, wherein the value of the variable resistor is based on minimization of the peak voltage swing.

Example 12.5 includes the circuit of any of examples 1-8, further comprising an ADC electrically positioned between the DAC and the signal input.

Example 13 includes the circuit of any of examples 1-8, wherein the synthesized delay stage includes a delay line electrically positioned between the signal input and the resistor.

Example 14 includes the circuit of example 13, wherein the delay line is not electrically positioned between the signal input and the DAC.

Example 15 includes the circuit of example 13, wherein the ADC circuit has an OSR less than or equal to 4.

Example 16 includes the circuit of any of examples 1-8, wherein the ADC circuit includes a third residue amplifier stage with an input coupled with an output of the second residue amplifier stage.

Example 17 includes the circuit of example 16, wherein the DAC is a first DAC and the resistor is a first resistor, and wherein the synthesized delay stage further includes: a second DAC electrically positioned between the signal input and the input of the third residue amplifier stage; and a second resistor electrically positioned between the signal input and the input of the third residue amplifier stage.

Example 18 includes a method of manufacturing an ADC circuit, wherein the method comprises: identifying a signal input; electrically coupling an input of a first residue amplifier stage with the signal input; electrically coupling an input of a second residue amplifier stage with an output of the first residue amplifier stage; and electrically coupling a synthesized delay stage with the signal input and the input of the second residue amplifier stage, wherein the synthesized delay stage includes a DAC and a variable resistor.

Example 19 includes the method of example 18, wherein coupling the synthesized delay stage with the signal input and the input of the second residue amplifier stage includes electrically positioning the synthesized delay stage between the signal input and the input of the second residue amplifier stage.

Example 20 includes the method of example 18, wherein electrically coupling the synthesized delay stage includes: electrically coupling the DAC between the signal input and the input of the second residue amplifier stage; and electrically coupling the variable resistor between the signal input and the input of the second residue amplifier stage.

Example 21 includes the method of example 18, further comprising electrically coupling the synthesized delay stage with the output of the first residue amplifier stage.

Example 22 includes the method of example 18, wherein coupling the synthesized delay stage with the input of the second residue amplifier stage includes coupling the synthesized delay stage with an integrator of the second residue amplifier stage.

Example 23 includes the method of example 18, wherein electrically coupling the synthesized delay stage with the input of the second residue amplifier stage includes electrically coupling an output of the DAC with the input of the second residue amplifier stage.

Example 24 includes the method of any of examples 18-23, wherein the synthesized delay stage further includes an ADC component in series with the DAC.

Example 25 includes the method of any of examples 18-23, wherein the ADC circuit is to enable a lowpass filter and a bandpass filter in parallel with one another.

Example 26 includes the method of any of examples 18-23, wherein the synthesized delay stage is to introduce a delay into at least one signal pathway of the ADC circuit.

Example 27 includes the method of any of examples 18-23, wherein the resistor and DAC are in parallel with one another.

Example 28 includes the method of any of examples 18-23, wherein the ADC circuit has an OSR greater than or equal to 4.

Example 29 includes the method of any of examples 18-23, wherein the DAC is a cancellation DAC with a variable gain, and the method further comprises identifying a value of the variable gain is based on peak voltage swing at an output of the ADC circuit.

Example 30 includes the method of example 29, wherein identifying the value of the variable gain is based on minimizing the peak voltage swing.

Example 31 includes the method of any of examples 18-23, wherein the resistor is a variable resistor, and the method further comprises identifying a value of the variable resistor based on peak voltage swing at an output of the ADC circuit.

Example 32 includes the method of example 31, wherein identifying the value of the variable resistor is based on minimizing the peak voltage swing.

Example 33 includes the method of any of examples 18-23, wherein the synthesized delay stage includes a delay line in series with the resistor and in parallel with the DAC.

Example 34 includes the method of example 33, wherein the ADC circuit has an OSR less than or equal to 4.

Example 35 includes the method of any of examples 18-23, wherein the ADC circuit includes a third residue amplifier stage with an input coupled with an output of the second residue amplifier stage.

Example 36 includes the method of example 35, wherein the DAC is a first DAC and the resistor is a first resistor, and wherein the method further comprises coupling a second DAC and a second resistor of the synthesized delay stage to an input of the third residue amplifier stage.

Example 37 includes an electronic device comprising: an analog signal source to provide an analog signal; a processor to process a digital signal; and an ADC circuit to convert the analog signal to the digital signal, wherein the ADC circuit includes: a first residue amplifier stage communicatively coupled with the analog signal source; a second residue amplifier stage communicatively positioned between the first residue amplifier stage and the processor; and a synthesized delay stage that is communicatively positioned between the signal input and the input of the second residue amplifier stage, wherein the synthesized delay stage includes a DAC and a variable resistor.

Example 38 includes the electronic device of example 37, wherein the analog signal source is an antenna.

Example 38.5 includes the electronic device of example 37, further comprising a third residue amplifier stage communicatively positioned between the second residue amplifier stage and the processor, and further comprising a second synthesized delay stage that is communicatively positioned between the analog signal source and the input of the third residue amplifier stage, wherein the second synthesized delay stage includes a second DAC and a second variable resistor.

Example 39 includes the electronic device of example 37, wherein the synthesized delay stage is in parallel with the first residue amplifier stage.

Example 40 includes the electronic device of example 37, wherein the ADC circuit has an OSR greater than or equal to 4.

Example 41 includes the electronic device of example 37, wherein the DAC and the resistor are electrically coupled with an output of the first residue amplifier stage.

Example 42 includes the electronic device of example 37, wherein the second residue amplifier stage includes an integrator, and the DAC and resistor are coupled with an input of the integrator.

Example 43 includes the electronic device of example 37, wherein the synthesized delay stage further includes an ADC component electrically in series between the signal input and the DAC.

Example 44 includes the electronic device of example 37, wherein the ADC circuit enables a lowpass filter and a bandpass filter in parallel with one another.

Example 45 includes the electronic device of example 37, wherein the synthesized delay stage is to introduce a delay into at least one signal pathway of the ADC circuit.

Example 46 includes the electronic device of any of examples 37-45, wherein the DAC is a cancellation DAC with a variable gain, and a value of the variable gain is based on peak voltage swing at an output of the ADC circuit.

Example 47 includes the electronic device of example 46, wherein the value of the variable gain is based on minimization of the peak voltage swing.

Example 48 includes the electronic device of any of examples 37-45, wherein the resistor is a variable resistor, and a value of the variable resistor is based on peak voltage swing at an output of the ADC circuit.

Example 49 includes the electronic device of example 48, wherein the value of the variable resistor is based on minimization of the peak voltage swing.

Example 50 includes the electronic device of any of examples 37-45, wherein the resistor and the DAC are in parallel with one another.

Example 51 includes the electronic device of example 50, wherein the synthesized delay stage includes a delay line in series with the resistor and in parallel with the DAC.

Example 52 includes the electronic device of example 51, wherein the ADC circuit has an OSR less than or equal to 4.

Example 53 includes the electronic device of any of examples 37-45, wherein the ADC circuit includes a third residue amplifier stage with an input coupled with an output of the second residue amplifier stage.

Example 54 includes the electronic device of example 53, wherein the DAC is a first DAC and the resistor is a first resistor, and wherein the synthesized delay stage further includes a second DAC and a second resistor coupled with the input of the third residue amplifier stage.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A circuit for use in an analog-to-digital converter (ADC) circuit, wherein the circuit comprises:
   a first residue amplifier stage coupled with a signal input;
   a second residue amplifier stage with an input coupled with an output of the first residue amplifier stage; and
   a synthesized delay stage that includes:
      a digital-to-analog converter (DAC) electrically positioned between the signal input and the input of the second residue amplifier stage; and
      a resistor electrically positioned between the signal input and the input of the second residue amplifier stage.

2. The circuit of claim 1, wherein the DAC is a cancellation DAC with a variable gain, and a value of the variable gain is based on a peak voltage swing at an output of the ADC circuit.

3. The circuit of claim 1, further comprising an analog-to-digital convertor (ADC) electrically positioned between the DAC and the signal input.

4. The circuit of claim 1, wherein the synthesized delay stage includes a delay line electrically positioned between the signal input and the resistor.

5. The circuit of claim 4, wherein the ADC circuit has an over-sampling ratio (OSR) less than or equal to 4.

6. The circuit of claim 1, wherein the ADC circuit includes a third residue amplifier stage with an input coupled with an output of the second residue amplifier stage, and the synthesized delay stage further includes a further DAC electrically positioned between the signal input and the input of the third residue amplifier stage and a further resistor electrically positioned between the signal input and the input of the third residue amplifier stage.

7. An electronic device comprising:
   an analog signal source to provide an analog signal;
   a processor to process a digital signal; and
   an analog-to-digital convertor (ADC) circuit to convert the analog signal to the digital signal, wherein the ADC circuit includes:
      a first residue amplifier stage communicatively coupled with the analog signal source;
      a second residue amplifier stage communicatively positioned between the first residue amplifier stage and the processor; and
      a synthesized delay stage that is communicatively positioned between the analog signal source and an input of the second residue amplifier stage, wherein the synthesized delay stage includes a digital-to-analog converter (DAC) and a variable resistor.

8. The electronic device of claim 7, further comprising a third residue amplifier stage communicatively positioned between the second residue amplifier stage and the processor, and further comprising a second synthesized delay stage that is communicatively positioned between the analog signal source and an input of the third residue amplifier stage, wherein the second synthesized delay stage includes a second DAC and a second variable resistor.

9. The electronic device of claim 7, wherein the synthesized delay stage is in parallel with the first residue amplifier stage.

10. The electronic device of claim 7, wherein the ADC circuit has an over-sampling ratio (OSR) greater than or equal to 4.

11. The electronic device of claim 7, wherein the DAC and the variable resistor are electrically coupled with an output of the first residue amplifier stage.

12. The electronic device of claim 7, wherein the second residue amplifier stage includes an integrator, and the DAC and resistor are coupled with an input of the integrator.

13. The electronic device of claim 7, wherein the synthesized delay stage further includes an ADC component electrically in series between the analog signal source and the DAC.

14. The electronic device of claim 7, wherein the ADC circuit enables a lowpass filter and a bandpass filter in parallel with one another.

15. The electronic device of claim 7, wherein the synthesized delay stage is to introduce a delay into at least one signal pathway of the ADC circuit.

16. A method of manufacturing an analog-to-digital converter (ADC), wherein the method comprises:
coupling an input of a first residue amplifier stage with a signal input;
coupling an input of a second residue amplifier stage with an output of the first residue amplifier stage; and
coupling a synthesized delay stage with the signal input and the input of the second residue amplifier stage, wherein the synthesized delay stage includes a digital-to-analog converter (DAC) and a variable resistor.

17. The method of claim 16, wherein coupling the synthesized delay stage with the signal input and the input of the second residue amplifier stage includes electrically positioning the synthesized delay stage between the signal input and the input of the second residue amplifier stage.

18. The method of claim 16, wherein coupling the synthesized delay stage includes:
coupling the DAC between the signal input and the input of the second residue amplifier stage; and
coupling the variable resistor between the signal input and the input of the second residue amplifier stage.

19. The method of claim 16, further comprising coupling the synthesized delay stage with the output of the first residue amplifier stage.

20. The method of claim 16, wherein coupling the synthesized delay stage with the input of the second residue amplifier stage includes coupling an output of the DAC with the input of the second residue amplifier stage.

21. A method for generating an amplified residue, comprising:
quantizing, by an analog-to-digital converter (ADC), an input signal;
receiving, by a first digital-to-analog converter (DAC) and a second DAC, an output of the ADC;
amplifying, by a residue amplifier, a residue signal, wherein the residue amplifier includes a first integrator and a second integrator receiving an output of the first integrator, and the residue signal is based on the input signal and an output of the first DAC;
feeding an output of the second DAC to an input of the second integrator of the residue amplifier; and
feeding, via a resistor, the input signal to the input of the second integrator of the residue amplifier.

22. The method of claim 21, wherein the residue amplifier further includes a third integrator receiving an output of the second integrator, and the method further comprises:
receiving, by a third DAC, an output of the ADC;
feeding an output of the third DAC to an input of the third integrator of the residue amplifier; and
feeding, via a further resistor, the input signal to the input of the third integrator of the residue amplifier.

23. The method of claim 21, further comprising:
adjusting a resistance of the resistor.

24. The method of claim 21, further comprising:
adjusting a gain of the second DAC.

25. The circuit of claim 1, wherein the resistor is a variable resistor, and a value of the variable resistor is based on a peak voltage swing at an output of the ADC circuit.

26. The circuit of claim 25, wherein the value of the variable resistor is based on a minimization of the peak voltage swing.

27. The circuit of claim 2, wherein the value of the variable gain is based on a minimization of the peak voltage swing.

28. The circuit of claim 1, wherein the ADC circuit has an over-sampling ratio (OSR) greater than or equal to 4.

29. The circuit of claim 1, wherein the second residue amplifier stage includes an integrator, and the DAC and resistor are coupled with an input of the integrator.

30. The circuit of claim 1, further comprising an ADC component electrically positioned between the signal input and the DAC.

* * * * *